Feb. 9, 1971 P. L. CONANT, SR 3,562,654

ELECTRONIC COUNTER

Filed May 21, 1968 2 Sheets-Sheet 1

INVENTOR.
PAUL L. CONANT, SR.

BY Henry K. Woodward
ATTORNEY

Feb. 9, 1971 P. L. CONANT, SR 3,562,654

ELECTRONIC COUNTER

Filed May 21, 1968 2 Sheets-Sheet 2

INVENTOR.
PAUL L. CONANT, SR.

By Henry K. Woodward

ATTORNEY

United States Patent Office 3,562,654
Patented Feb. 9, 1971

3,562,654
ELECTRONIC COUNTER

Paul L. Conant, Sr., Richardson, Tex., assignor to Collins Radio Company, Cedar Rapids, Iowa, a corporation of Iowa Filed May 21, 1968, Ser. No. 730,720
Int. Cl. H03k *21/32*
U.S. Cl. 328—48 4 Claims

ABSTRACT OF THE DISCLOSURE

An electronic counter including a plurality of serially connected flip-flops with the first flip-flop connected to receive a clock input signal and the output of each flip-flop providing the trigger input to the succeeding flip-flop. Outputs of selected flip-flops, in accordance with a desired count ratio, are connected to the inputs of an AND gate, and the output of the AND gate is connected to the counter output terminal. All other flip-flop outputs are connected to the inputs to an OR gate with the output of the OR gate operatively connected to switch means for clamping off the counter output terminal.

This invention relates to electronic counter circuits and more particularly to counter circuits utilizing a series of binary switching circuits such as used in computers.

Electronic counters using binary switching stages are widely used in computer systems. Commonly, the binary switching stages, normally binary connected Eccles-Jordan bistable circuits or flip-flops, are serially connected with gating means interconnecting selected stages to control the switching sequence and thereby effect a desired count. To this end, numerous elaborate and complex schemes have been devised to modify the normal switching sequence of the binary switching stages.

An object of this invention is an improved and simplified electronic counter circuit.

Another object of the invention is an electronic counter circuit utilizing binary switching stages but which does not employ elaborate gating interconnection between the stages.

Still another object of the invention is an electronic counter circuit utilizing serially connected binary switching elements which are serially and sequentially switched.

Another object is an electronic counter circuit including means for preventing spurious outputs.

Yet another object of the invention is an electronic counter circuit which provides an output having a pulse width and phase substantially the same as the input signal.

Still another object of the invention is an electronic counter circuit which lends itself to integrated circuit fabrication.

These and other objects and features of the invention will be apparent from the following description and claims.

In accordance with the invention, an electronic counter circuit is provided which includes a plurality of serially connected binary switching stages with each stage providing the trigger input to the succeeding stage. Outputs from selected stages, depending on the desired count or divide ratio, are connected to the inputs of an AND gate or like concurrent gating means with the output of the gate connected to the counter output terminal. The outputs of all other binary switch stages are connected to the inputs of an OR gate with the output of the OR gate operatively connected to clamp off the counter output terminal when an input is provided to the OR gate. Preferably, the input clock signal is also connected to an input of the AND gate to effect proper phase and pulse width of the counter output pulse.

The invention will be more fully understood from the following detailed description and appended claims when taken with the drawing in which:

FIG. 1 is a functional block diagram of serially connected bistable circuits;

FIGS. 2*a*–2*f* are curves representing voltage-time relationships in the circuit of FIG. 1;

Figure 1:
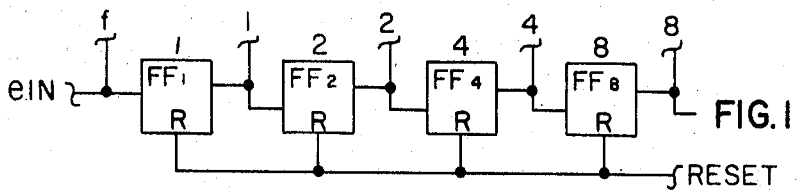

Referring now to the drawings, and in particular to FIG. 1, four serially connected bistable circuits or flip-flops designated $FF_1$, $FF_2$, $FF_4$, and $FF_8$, respectively, will cooperatively function to provide a count of up to 15 in accordance with the present invention. The input clock signal, designated $E_{in}$, is operatively connected to the input of $FF_1$ whereby $FF_1$ generates an output pulse in response to the first input pulse applied thereto after a reference time of $T=0$. The output of $FF_1$ is operatively connected to the input of $FF_2$ whereby the lagging edge of a pulse generated by $FF_1$ triggers $FF_2$. Similarly, the lagging edge of pulses from $FF_2$ triggers $FF_4$; and the lagging edge of pulses from $FF_4$ triggers $FF_8$. The outputs of $FF_1$, $FF_2$, $FF_4$ and $FF_8$ are designated 1, 2, 4, and 8, respectively, and the input of $FF_1$ is designated *f*. A reset line is connected to the reset terminals of each of the flip-flops to provide a reset signal to the flip-flops after a desired count is obtained.

Figures 2A, 2B, 2C, 2D, 2E, 2F:
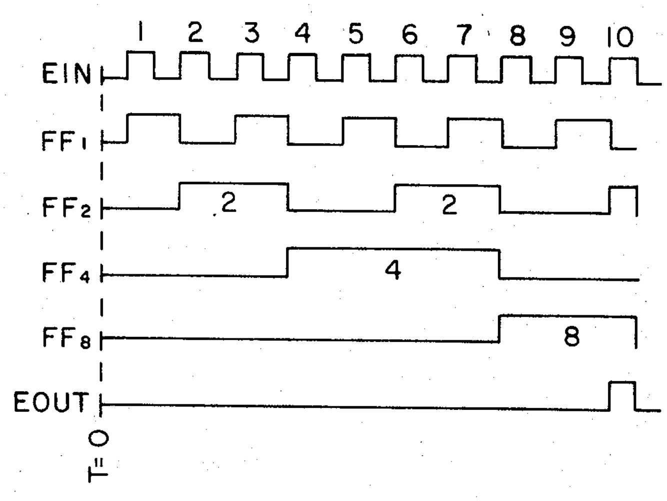

To illustrate the operation of the present electronic counter circuit, it will be assumed that an output pulse is desired for every ten input pulses, i.e., a divide by ten function is desired. The voltage-time relationship for each of the flip-flops with respect to the input signal $E_{in}$ is illustrated in FIGS. 2*a*–2*e*. FIG. 2*a* shows ten pulses of $E_{in}$ measured from a reference time $T=0$. In FIG. 2*b* it is seen that $FF_1$ generates a positive pulse upon receipt of the first pulse of $E_{in}$, and thereafter provides a divide by two function relative to $E_{in}$. Assuming that all of the flip-flops are triggered by negative-going voltages, it is necessary to provide $E_{in}$ through an inverter to the input of $FF_1$. $FF_2$ is responsive to negative-going voltages at the output of $FF_1$ and generates a pulse corresponding in time to the second pulse of $E_{in}$ as shown in FIG. 2*c*. Similarly, $FF_4$ generates a pulse corresponding in time to pulse 5 of $E_{in}$ and $FF_8$ generates a pulse corresponding in time to the eighth pulse of $E_{in}$ and shown in FIG. 2*d* and FIG. 2*e*, respectively.

Referring to FIG. 2*f*, it will be noted that the output pulse, $E_{out}$, corresponding to the tenth pulse of $E_{in}$ occurs in time concurrently with an output of $FF_8$ and $FF_2$. Therefore, to provide a divide by ten function, output terminals 2 and 8 of flip-flops $FF_2$ and $FF_8$, respectively, are connected through an AND gate to the counter output terminal. The output pulse is also used to reset each of the flip-flops.

Figure 3:
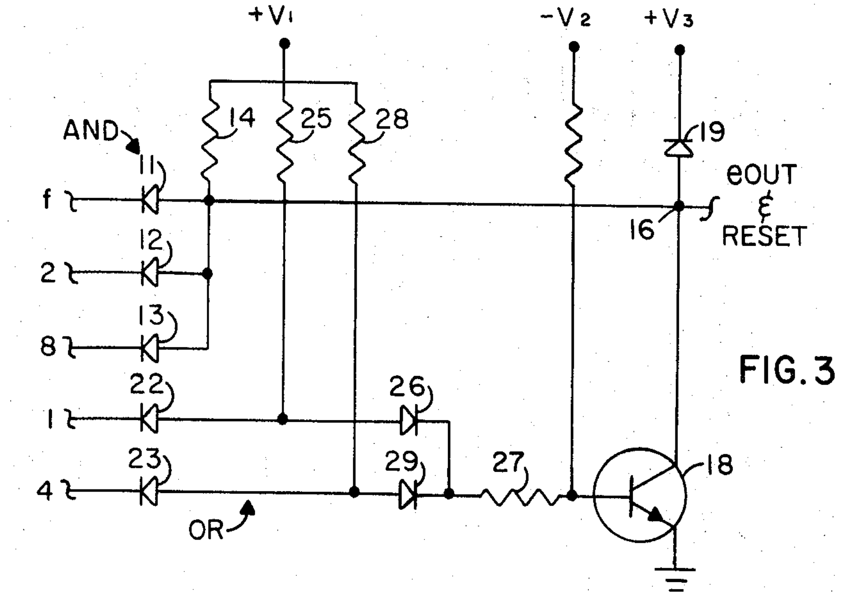
FIG. 3 is a schematic diagram for a circuit which provides a desired count output in accordance with the invention.

FIG. 3 is a schematic diagram of a circuit which is operatively connected with the bistable circuits illustrated in FIG. 1 to provide the count of ten function. Diodes 11, 12, and 13, which are connected through resistor 14 to a source of positive potential $V_1$, comprise an AND gate with the cathodes of the diodes connected to receive inputs *f*, 2, and 8, respective, from the circuit in FIG. 1. The anodes of the diodes 11, 12, and 13 are connected to the output terminal 16, where the output signal $E_{out}$ is generated. Terminal 16 also corresponds to the collector of transistor 18 which is connected through diode 19 to a positive source of potential $V_3$. So long as transistor 18 is not conducting, an output from the AND gate, depending upon the concurrent inputs of *f*, 2, and 8, will produce an output pulse. It should be noted that the provision of the input *f* is merely to ensure the proper phase and pulse width of the output pulse with respect to the tenth input pulse.

To prevent a spurious output a terminal 16, the unused outputs of flip-flops, namely the outputs of $FF_1$ and $FF_4$, are connected through an OR gate comprising diodes 22 and 23 which controls the conductivity of transistor 18. Should a positive output be present at either terminal 1 or 4, either diode 22 or diode 23 will be reversed biased and thus allow positive voltage from $V_1$ to be transmitted through either resistor 25, diode 26, and resistor 27 or through resistor 28, diode 29, and resistor 27 to the base of transistor 18 thereby forward biasing the NPN transistor 18 and clamping the output terminal 16 to ground potential. Thus, only upon the occurrence of no inputs to the OR gate and the occurrence of all inputs to the AND gate will an output $E_{out}$ be present at terminal 16. The lagging edge of the output pulse, $E_{out}$, is utilized to reset all of the flip-flops and thereby initiate a new counting sequence.

Figure 5:
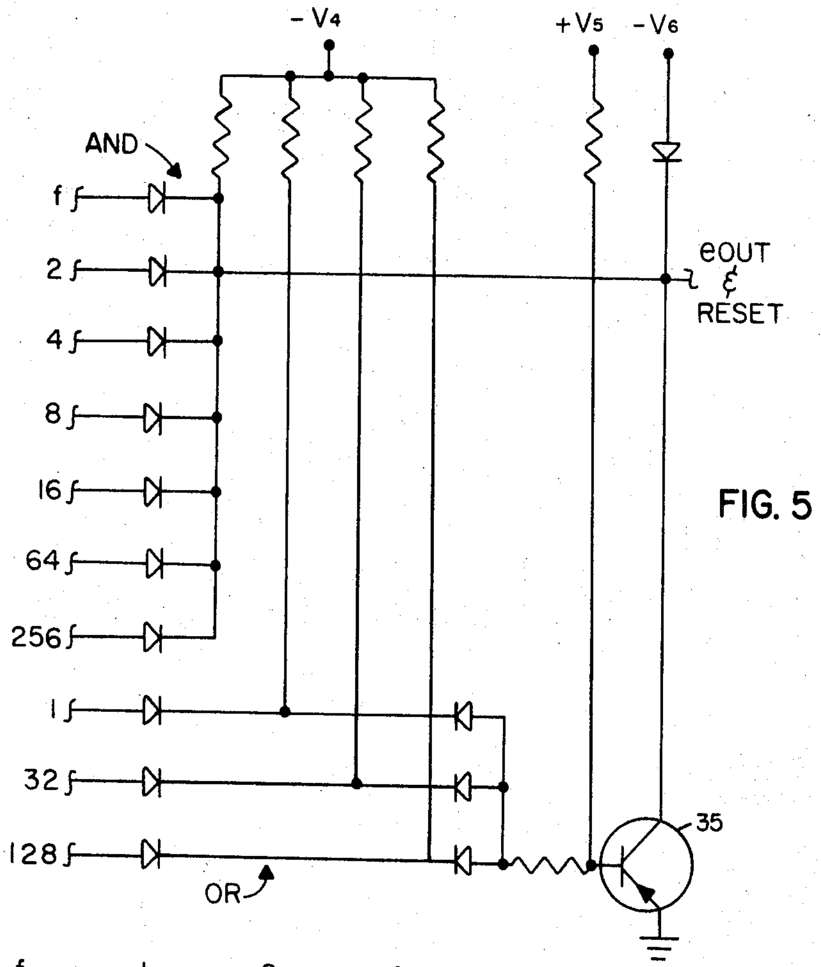
FIG. 5 is a schematic diagram of a circuit which cooperatively functions with the circuit shown in FIG. 4 to produce a desired count output in accordance with the invention.
Figure 4:
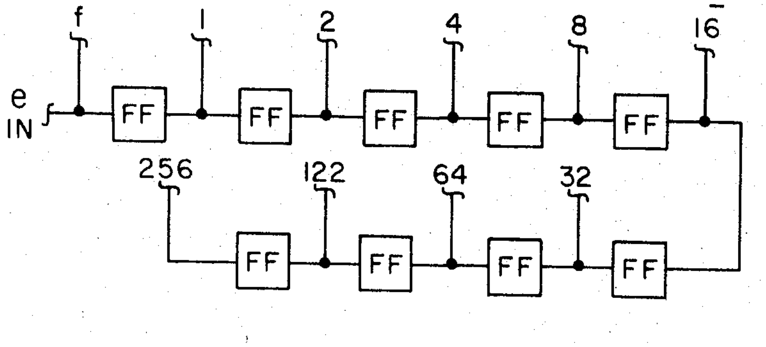
FIG. 4 is a functional block diagram of serially connected bistable circuits.

FIG. 4 and FIG. 5 illustrate an another embodiment of the pulse counter circuit for providing a count of every 350 input pulses. In FIG. 4, it is seen that eight bistable circuits provide binary counting up to 256 ($2^8$). Since 256+64+16+8+4+2 equal 350, these terminals from the circuit in FIG. 4 are connected to the input of an AND gate shown in the schematic diagram in FIG. 5. The other unused terminals of FIG. 4, namely 1, 32, and 128, are connected to the input of the OR gate of FIG. 5 and control the conductivity of transistor 35 in a similar manner as described above with respect to FIG. 3. It will be noted that transistor 35 is of the PNP type, therefore the polarity of all voltages in FIG. 5 are opposite to the polarity of FIG. 4, and the diodes are connected in reverse polarity.

Thus, it is seen that a counter for any number of pulses may be provided in accordance with the invention simply by AND gating selective outputs of the serially connected bistable circuits.

Since the described pulse counter circuit requires only resistors, diodes, and transistors, the counter lends itself to integrated circuit fabrication. Thus, the entire counter can be formed in a single wafer of semiconductor material.

While the invention has been described with reference to specific embodiments, the description is illustrative and not to be construed as limiting the scope of the invention. Various modifications and changes may occur to those skilled in the art without departing from the spirit and scope of the invention as defined by the appended claims.

I claim:

1. An electronic counter circuit comprising:

(a) a plurality of serially connected switching means, each switching means having at least one input terminal and an output terminal, the input terminal of the first switching means being operatively connected to receive a clock input signal, the output of each switching means providing the trigger signal to the input terminal of the succeeding switching means, (b) a concurrent gating means having a plurality of input terminals and an output terminal, (c) means connecting the outputs of selected switching means in accordance with a desired count to said input terminals of said concurrent gating means, (d) a counter output terminal, (e) means connecting the output of said concurrent gating means to said counter output terminal, (f) means connecting the clock input signal to an input terminal of said concurrent gating means, and (g) an OR gate means having a plurality of input terminals and an output terminal, means connecting all of the outputs of said switching means other than said selected switching means to the input terminals of said OR gate means, switch means for connecting said counter output terminal to a reference potential indicative of no output signal present on said counter output terminal, and means operatively connecting the output terminal of said OR gate means to said switch means whereby said switch means is conductive when a signal is received from said OR gate means.

2. An electronic counter circuit comprising:

(a) a plurality of serially connected switching means, each switching means having at least one input terminal and an output terminal, the input terminal of the first switching means being operatively connected to receive a clock input signal, the output of each switching means providing the trigger signal to the input terminal of the succeeding switching means, (b) a concurrent gating means having a plurality of input terminals and an output terminal, (c) means connecting the outputs of selected switching means in accordance with a desired count to said input terminals of said concurrent gating means, (d) a counter output terminal, (e) means connecting the output of said concurrent gating means to said counter output terminal, (f) an OR gate means having a plurality of input terminals and an output terminal, means connecting all of the outputs of said switching means other than said selected switching means to the input terminals of said OR gate means, (g) switch means for connecting said counter output terminal to a reference potential indicative of no output signal present on said counter output terminal, and (h) means operatively connecting the output terminal of said OR gate means to said switch means whereby said switch means is conductive when a signal is received from said OR gate means.

3. An electronic counter circuit as defined by claim 2 wherein said switching means are flip-flop circuit, and said concurrent gating means is an AND gate.

4. An electronic counter circuit as defined by claim 3 and further including means connecting the clock input signal to an input terminal of said AND gate.

References Cited

UNITED STATES PATENTS

| | | | |
|---|---|---|---|
| 2,762,915 | 9/1956 | Bagley | 328—48X |
| 2,771,550 | 11/1956 | Hampton | 328—48X |
| 2,868,455 | 1/1959 | Bruce et al. | 307—225X |
| 2,896,092 | 7/1959 | Pugsley | 307—225 |
| 3,035,182 | 5/1962 | Reichert | 307—225X |

JOHN S. HEYMAN, Primary Examiner

U.S. Cl. X.R.

307—218, 224, 226; 328—45, 49